United States Patent
Hendrix et al.

(10) Patent No.: US 9,632,547 B2
(45) Date of Patent: Apr. 25, 2017

(54) COOLING MODULE FOR MODULAR DATA CENTER AND SYSTEM COMPRISING THE COOLING MODULE AND AT LEAST ONE SERVER MODULE

(71) Applicant: CommScope, Inc. of North Carolina, Hickory, NC (US)

(72) Inventors: Walter Mark Hendrix, Richardson, TX (US); Deepak Kumar Sivanandan, Dallas, TX (US)

(73) Assignee: CommScope, Inc. of North Carolina, Hickory, NC (US)

(*) Notice: Subject to any disclaimer, the term of this patent is extended or adjusted under 35 U.S.C. 154(b) by 596 days.

(21) Appl. No.: 13/667,091

(22) Filed: Nov. 2, 2012

(65) Prior Publication Data

US 2013/0111937 A1 May 9, 2013

Related U.S. Application Data

(60) Provisional application No. 61/555,097, filed on Nov. 3, 2011.

(51) Int. Cl.
*F28C 3/08* (2006.01)
*G06F 1/20* (2006.01)
*H05K 7/20* (2006.01)
*F24F 5/00* (2006.01)
*F24F 6/14* (2006.01)
(Continued)

(52) U.S. Cl.
CPC .............. *G06F 1/20* (2013.01); *F24F 5/0035* (2013.01); *F24F 6/14* (2013.01); *H05K 7/20345* (2013.01); *H05K 7/20745* (2013.01); *F24F 2003/1617* (2013.01); *F24F 2011/0006* (2013.01); *F28C 3/08* (2013.01); *Y02B 30/545* (2013.01)

(58) Field of Classification Search
CPC ... G06F 1/20; F24F 5/0035; F24F 6/14; F24F 2003/1617; F24F 2011/0006; H05K 7/20; H05K 7/20745; H05K 7/20345
USPC .................................. 95/211, 259, 227, 233
See application file for complete search history.

(56) References Cited

U.S. PATENT DOCUMENTS 1,075,197 A * 10/1913 Oramer ..................... F24F 3/14
236/13
2,144,693 A * 1/1939 Seid .......................... F24F 3/14
165/249

(Continued)

FOREIGN PATENT DOCUMENTS

WO WO 2009/137215 A2 11/2009
WO WO 2010/050953 A1 5/2010
WO WO 2011/053988 A2 5/2011

*Primary Examiner* — Allana Lewin Bidder
*Assistant Examiner* — Kun Kai Ma
(74) *Attorney, Agent, or Firm* — Muncy, Geissler, Olds & Lowe, P.C.

(57) ABSTRACT

A cooling module for cooling at least two server modules that are configured to house a plurality of servers, the cooling module including a housing having an interior containing air, an intake into the housing, an outlet from the housing, at least one fan configured to move the air from the intake to the outlet and at least one sprayer configured to spray a mist into the air in the interior for evaporative cooling of the interior. Also a system formed of the cooling module, first and second server modules and a plenum connecting the outlet of the cooling module and intakes of the first and second server modules.

15 Claims, 8 Drawing Sheets

(51) Int. Cl.
*F24F 3/16* (2006.01)
*F24F 11/00* (2006.01)

(56) References Cited

U.S. PATENT DOCUMENTS

| | | | | |
|---|---|---|---|---|
| 2,882,996 | A * | 4/1959 | Lanier | F28C 1/02 261/111 |
| 3,212,424 | A * | 10/1965 | Davis | F24F 3/0522 165/59 |
| 3,479,948 | A * | 11/1969 | Mathews | F24F 13/15 165/96 |
| 3,791,102 | A * | 2/1974 | Huntington | B01D 47/00 165/104.25 |
| 3,973,590 | A * | 8/1976 | Logsdon | F16K 11/16 137/599.03 |
| 4,440,698 | A * | 4/1984 | Bloomer | F28D 5/02 165/908 |
| 5,425,902 | A * | 6/1995 | Miller | B01J 19/32 261/128 |
| 5,620,503 | A * | 4/1997 | Miller | B01J 19/32 261/128 |
| 6,092,794 | A * | 7/2000 | Reens | B01F 3/04049 261/115 |
| 6,293,121 | B1 * | 9/2001 | Labrador | 62/304 |
| 7,278,273 | B1 | 10/2007 | Whitted | |
| 2003/0172669 | A1 | 9/2003 | Tilton et al. | |
| 2004/0184232 | A1 | 9/2004 | Fink | |
| 2005/0086967 | A1 * | 4/2005 | Pavlik | F24F 5/0035 62/304 |
| 2007/0218828 | A1 * | 9/2007 | Baik | 454/256 |
| 2009/0078401 | A1 | 3/2009 | Cichanowicz | |
| 2009/0126385 | A1 | 5/2009 | Trepte | |
| 2009/0149124 | A1 * | 6/2009 | Stevenson | B60H 1/00671 454/358 |
| 2010/0130117 | A1 | 5/2010 | Larsen | |
| 2010/0146996 | A1 | 6/2010 | Campbell | |
| 2010/0300650 | A1 * | 12/2010 | Bean, Jr. | 165/67 |
| 2011/0056651 | A1 | 3/2011 | Monk | |
| 2011/0083824 | A1 * | 4/2011 | Rogers | H05K 7/20745 165/80.2 |
| 2011/0151765 | A1 | 6/2011 | Chen et al. | |
| 2011/0154842 | A1 | 6/2011 | Heydari | |
| 2011/0175498 | A1 * | 7/2011 | Bash et al. | 312/107 |
| 2011/0256822 | A1 | 10/2011 | Carlson | |

* cited by examiner

COOLING MODULE FOR MODULAR DATA CENTER AND SYSTEM COMPRISING THE COOLING MODULE AND AT LEAST ONE SERVER MODULE

CROSS-REFERENCE TO RELATED APPLICATIONS

The present application claims the benefit of U.S. Provisional Patent Application No. 61/555,097, filed Nov. 3, 2011, the entire contents of which are hereby incorporated by reference.

FIELD OF THE INVENTION

The present invention is directed to a cooling module for a modular data center and toward a system including the cooling module and a server module, and, more specifically, toward a cooling module employing a plurality of different cooling mechanisms for cooling server modules under different ambient conditions and toward a system including the cooling module and at least two server modules.

BACKGROUND OF THE INVENTION

Data centers are facilities that contain hundreds or thousands of computer servers that host web sites or applications for off-site customers and/or that provide large amounts of computer storage for remote users. The number and size of data centers continues to increase as consumers demand ever larger amounts of off-site storage and/or processing power. In an effort to increase the scalability of these data centers, modular data centers have been introduced. These modular data centers may comprise one or more racks of servers mounted in standard shipping containers which have their own power and/or cooling connections. Substantially any number of these modules can be assembled and interconnected to house a desired number of servers.

Data center servers produce a significant amount of heat and require large amounts of energy to cool. Air conditioning a data center can be quite expensive, and data center operators are desirous of finding cooling arrangements that can reduce their energy use / carbon footprint and also reduce costs. A variety of cooling arrangements are known. However, many of these arrangements are not easily integrateable with the server modules of a modular data center. For example, while a large number of server modules may be operated in a warehouse, cooling the entire warehouse is not the most efficient way to keep all the servers in the modules at a proper operating temperature. Each individual server module may alternately be provided with a conventional air conditioner having an evaporator and condenser, but operating a plurality of individual air conditioners in this manner can also be inefficient. It would therefore be desirable to provide a cooling module that integrates with one or more server modules in a manner that provides improved cooling of servers in the server modules in an energy efficient manner.

SUMMARY OF THE INVENTION

These problems and others are addressed by embodiments of the present invention, a first aspect of which comprises a cooling module for cooling at least two server modules that are configured to house a plurality of servers. The cooling module includes a housing having an interior containing air, an intake into the housing, an outlet from the housing, at least one fan configured to move the air from the intake to the outlet, and at least one sprayer configured to spray a mist into the air in the interior for evaporative cooling of the interior.

Another aspect of the invention comprises a system that includes a cooling module and first and second server modules. The first and second server modules each include a housing having an interior, an inlet into the interior, at least one rack holding a plurality of servers and at least one outlet. The cooling module includes a housing having an interior, an inlet into the cooling module interior and an outlet from the cooling module interior, at least one fan configured to move air through the cooling module interior to the cooling module outlet, and at least one sprayer configured to spray a mist into the cooling module interior. The system also includes a plenum connecting the cooling module outlet to the inlets of the first and second server modules.

A further aspect of the invention comprises a system that comprises a cooling module and first and second server modules. The first and second server modules each include a housing having an interior, an inlet into the interior and an outlet from the interior, and the cooling module includes a housing having an interior, at least one inlet into the cooling module interior and an outlet from the cooling module interior. A cooling plenum connects the cooling module outlet to the inlet of the first server module and to the inlet of the second server module, and an exhaust plenum connects the outlet of the first server module and the outlet of the second server module. An inlet plenum connects the exhaust plenum to the at least one inlet into the cooling module interior, and the system also includes a controller and a plurality of sensors in communication with the controller. The cooling module has at least one fan configured to draw air through the at least one inlet of the cooling module into the cooling module interior and to expel air through the cooling module outlet into the cooling plenum, a filter for filtering substantially all air flowing through the cooling module, a plurality of spray nozzles configured to spray a mist into the cooling module interior, and a mist collector having a plurality of mist collector elements mounted to a plurality of supports for removing at least some of the mist from the air in the cooling module interior. The plurality of supports are mounted for rotation about an axis perpendicular to an airflow direction through the cooling module and are shiftable from a first position in which a first portion of the air in the cooling module interior moving from the at least one intake of the cooling module to the cooling module outlet passes through the plurality of supports to a second position in which a second portion of the air in the cooling module interior moving from the at least one intake of the cooling module to the cooling module outlet passes through the plurality of supports, where the second portion is less than the first portion or is substantially zero.

The first server module housing includes a first end wall at an intake end of the first server module housing, a second end at an outlet end of the first server module housing, and a first side wall and a second side wall spaced from the first side wall and connecting the first end wall and the second end wall. The first server module also includes a first rack spaced from the first side wall by a first gap and a second rack spaced from the first rack by a center aisle and spaced from the second side wall by a second gap. The inlet of the first server module is configured to direct air from the cooling plenum into the center aisle of the first server module, and the at least one outlet of the first server module comprises a first outlet from the first gap to the exhaust plenum and a second outlet from the second gap to the exhaust plenum. The plurality of servers are mounted in the first rack and in the second rack of the first server module such that substantially all air entering the inlet of the first server module must flow through the first rack or the second rack of the first server module to reach the first and second outlets of the first server module. The system also includes a first heat exchanger positioned upstream of the plurality of spray nozzles for cooling air entering the cooling module, a second heat exchanger in the exhaust plenum carrying a heat transfer medium to be heated by air exiting the first server module, a first plurality of louvers for controlling airflow to the cooling module intake and a first actuator for controlling the position of the first plurality of louvers and a second plurality of louvers in the exhaust plenum for controlling air flow from the first server module to the intake plenum and a second actuator for controlling the position of the second plurality of louvers. The controller is configured to control the first actuator, the second actuator, the plurality of fans, fluid flow through the plurality of spray nozzles, the positions of the plurality of supports, the positions of the first plurality of louvers and the positions of the second plurality of louvers based on signals received from the sensors.

BRIEF DESCRIPTION OF THE DRAWINGS

These and other aspects and features of the invention will be better understood after a reading of the following detailed description together with the attached drawings, wherein.

DETAILED DESCRIPTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 1:
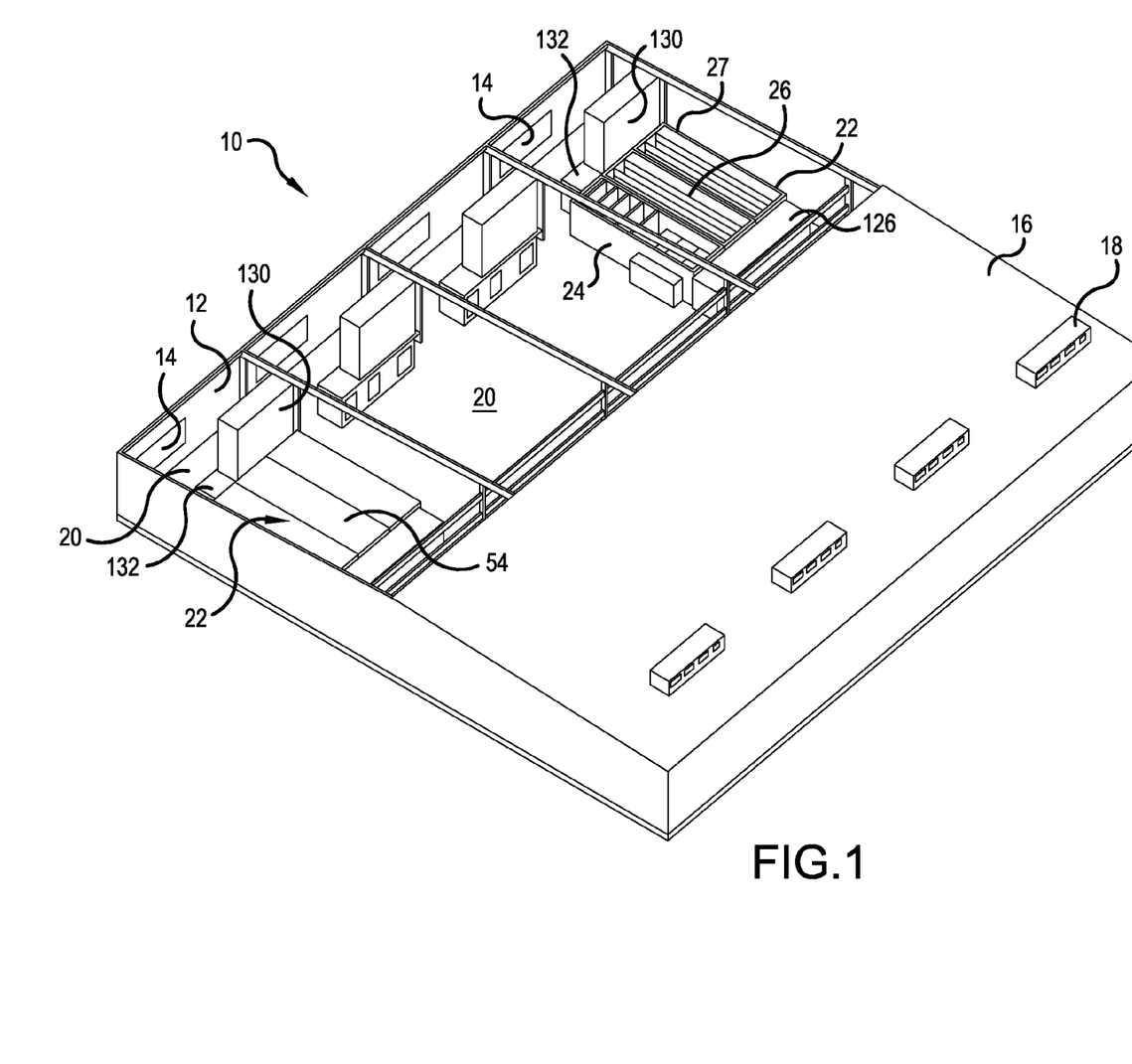
FIG. 1 is a perspective view of a data center building having a portion of the roof removed to show a plurality of locations for data center modules and showing data center modules in two of the locations.

FIG. 1 shows a data center 10 comprising side walls 12 having wall vent openings 14 and a roof 16 having roof vent openings 18. A portion of the roof 16 is removed for illustration purposes to show a plurality of locations 20 for placing data center modules 22, two of which are illustrated in this Figure. The data center 10 could have more or fewer locations 20 depending on the needs of the operator, and due to the modular nature thereof, can be expanded by adding more locations 20 and more data center modules 22 thereto.

Figure 2:
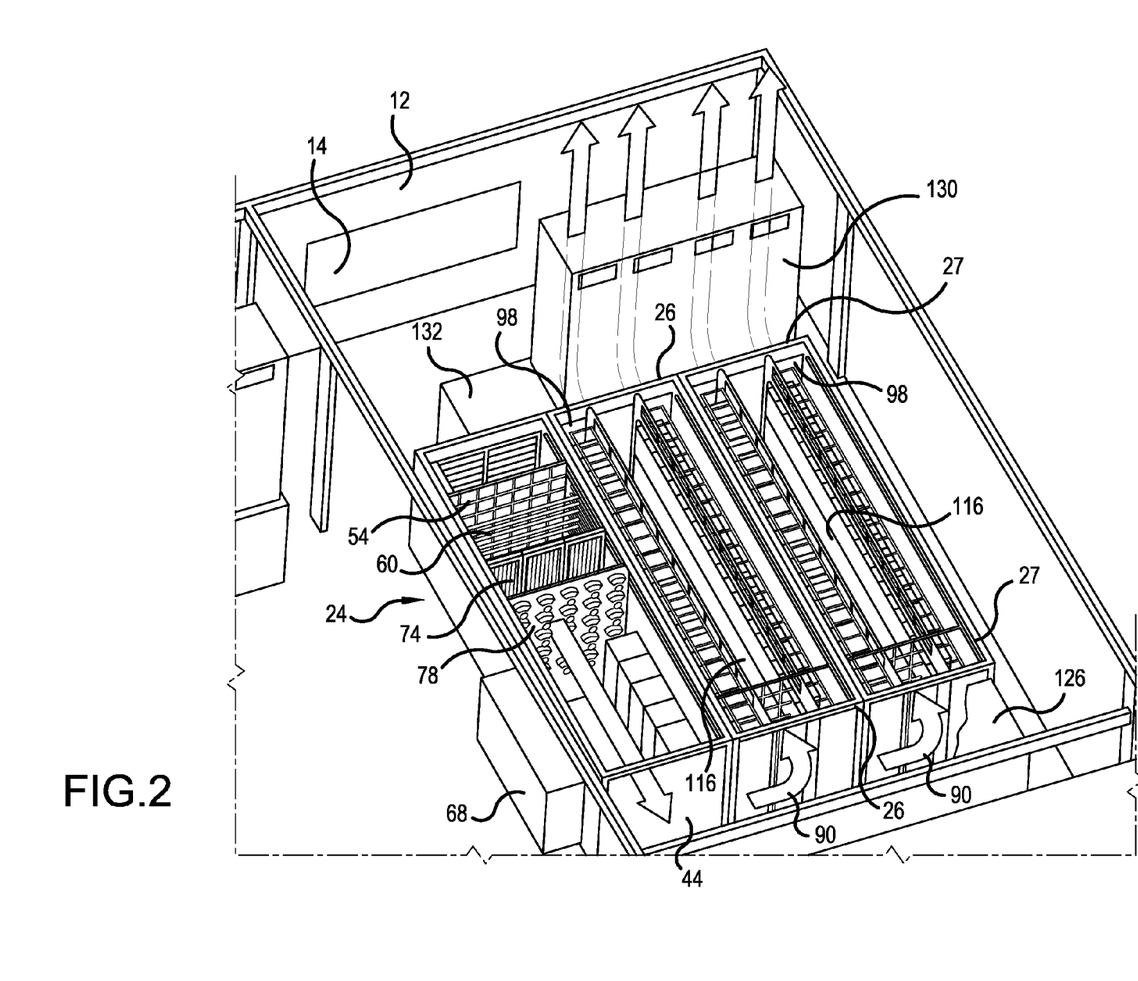
FIG. 2 is a perspective view of one of the data center modules of FIG. 1 which includes a cooling module and first and second server modules.

FIG. 2 shows a data center module 22 in one of the locations 20 which includes a cooling module 24, a first server module 26 and a second server module 27. The first and second server modules 26 and 27 are substantially identical to one another and only the first server module 26 will be described in detail herein. More than two server modules could be used with a single cooling module 24 if desired, especially if these server modules are smaller than the cooling module 24 or if they contain fewer servers than are contained in the server modules described herein; however, the cooling module 24 is believed to provide adequate cooling for a volume that is about double the volume of the cooling module itself when two racks of servers are present in each of two server modules as described hereinafter.

Figure 3:
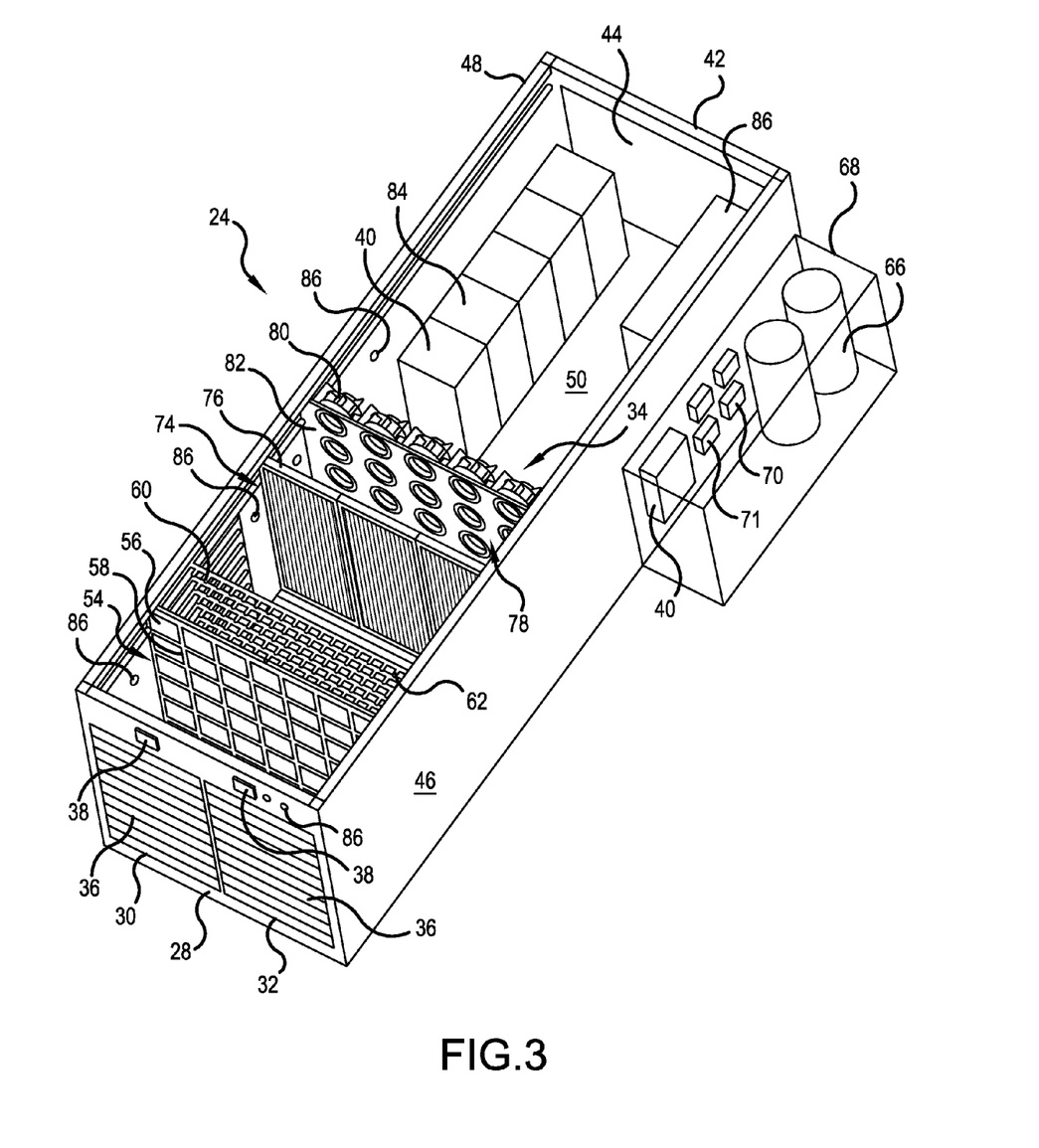
FIG. 3 is a perspective view of the cooling module of FIG. 2 which includes a filter, fans, spray nozzles and a mist collector in a first configuration for removing mist from the air in the cooling module.

As illustrated in FIG. 3, the cooling module 24 is formed from an intake end wall 28 having a first intake opening 30 and a second intake opening 32 into the interior 34 of the cooling module 24. The first and second intake openings 30, 32 are selectively closable by louvers 36 which are opened and closed by actuators 38 associated therewith. While louvers are generally effective, other arrangements of one or more flaps that selectively block airflow passages could alternately be used. The louvers 36 and other elements of the system described herein are controlled by a controller 40 described further below. The cooling module 24 has an outlet end wall 42 with an outlet 44, and a first side wall 46 and a second side wall 48 connect the intake end wall 28 and the outlet end wall 42. The cooling module 24 also has a floor 50 and a cover 54. The cover 54 is shown on one of the data center modules 22 in FIG. 1 but has been removed in all other figures to expose the components inside the cooling module 24. The cooling module 24 and the first and second server modules 26, 27 may be formed from steel or any suitable material and may be constructed specifically for use in a modular data center application. It also may be possible to convert conventional forty-foot shipping containers (also known as intermodal freight shipping containers or CONEX) into the cooling module 24 and the first and second server modules 26, 27, further standardizing the size and shape of the modules.

A filter bank 54 is located near the intake end wall 28 of the cooling module 24 and comprises a plurality of filter elements 56 mounted in a frame 58 that extends between the first and second side walls 46, 48 of the cooling module 24 and from the floor 50 to the cover 52 of the cooling module 24 so that substantially all air flowing through the interior 34 of the cooling module 24, from the first and second intake openings 30, 32 to the outlet 44, passes through one of the filter elements 56. (The terms "upstream" and "downstream" may be used herein to indicate locations and directions relative to the airflow direction through the cooling module 24 and through the first and second server modules 26, 27.) The filter elements 56 may comprise, for example, conventional 20 inch by 20 inch filters with ratings from MERV-8 to MERV-16, and these filter elements 56 slide into and out of frame 58 and are retained therein in a manner that does not require the use of tools.

Downstream from the filter bank 54 is an array of water pipes 60 with a plurality of spray nozzles 62, sometime referred to herein collectively as a "sprayer." The water pipes 60 are connected to one or more water tanks 66 located in an external housing 68 that is connected to the first side wall 46 of the cooling module 24. The external housing 68 also includes pumps 70 and pump controllers 71 under the control of the controller 40, and under conditions discussed hereinafter, the pump controllers 71 cause the pumps 70 to pump water to the spray nozzles 62 to create a mist of water droplets in the space surrounding the water pipes 60 and between the water pipes 60 and the filter bank 54. The evaporation of the water mist cools the air in the cooling module 24. This cooling process, which may be referred to herein as an adiabatic cooling process or cycle, provides cool air in the interior of the cooling module 24 without the use of a more expensive and energy intensive conventional refrigeration cycle for cooling. Beneficially, the mist produced by spray nozzles 62 also increases the humidity of the air in the interior 34 of the cooling module 24 which may be desirable under some conditions.

The amount of water emitted from the spray nozzles 62 is controlled to provide a desirably high level of evaporative cooling to reduce the temperature of the air in the cooling module 24. However, it is likely that the mist will not completely evaporate, and it is generally undesirable for water droplets to enter the first and second server modules 26, 27. To remove water droplets from the air in the cooling module 24, the cooling module 24 is provided with a mist collector 74 downstream of the water pipes 60 on which water droplets in the mist collect as air passes through the mist collector. The mist collector 74 comprises various elements such as wires and/or rods and/or plates around which air must flow to traverse the mist collector 74. Water droplets entrained in this airflow are likely to contact these elements of the mist collector 74 and collect thereupon and drip or drain to a drain opening (not illustrated) on or near the floor 50. The air exiting the mist collector 74 will therefore be substantially free of entrained water droplets but may still have a higher humidity level than that of the air in the data center 10 outside of the data center modules 22.

Figure 4:
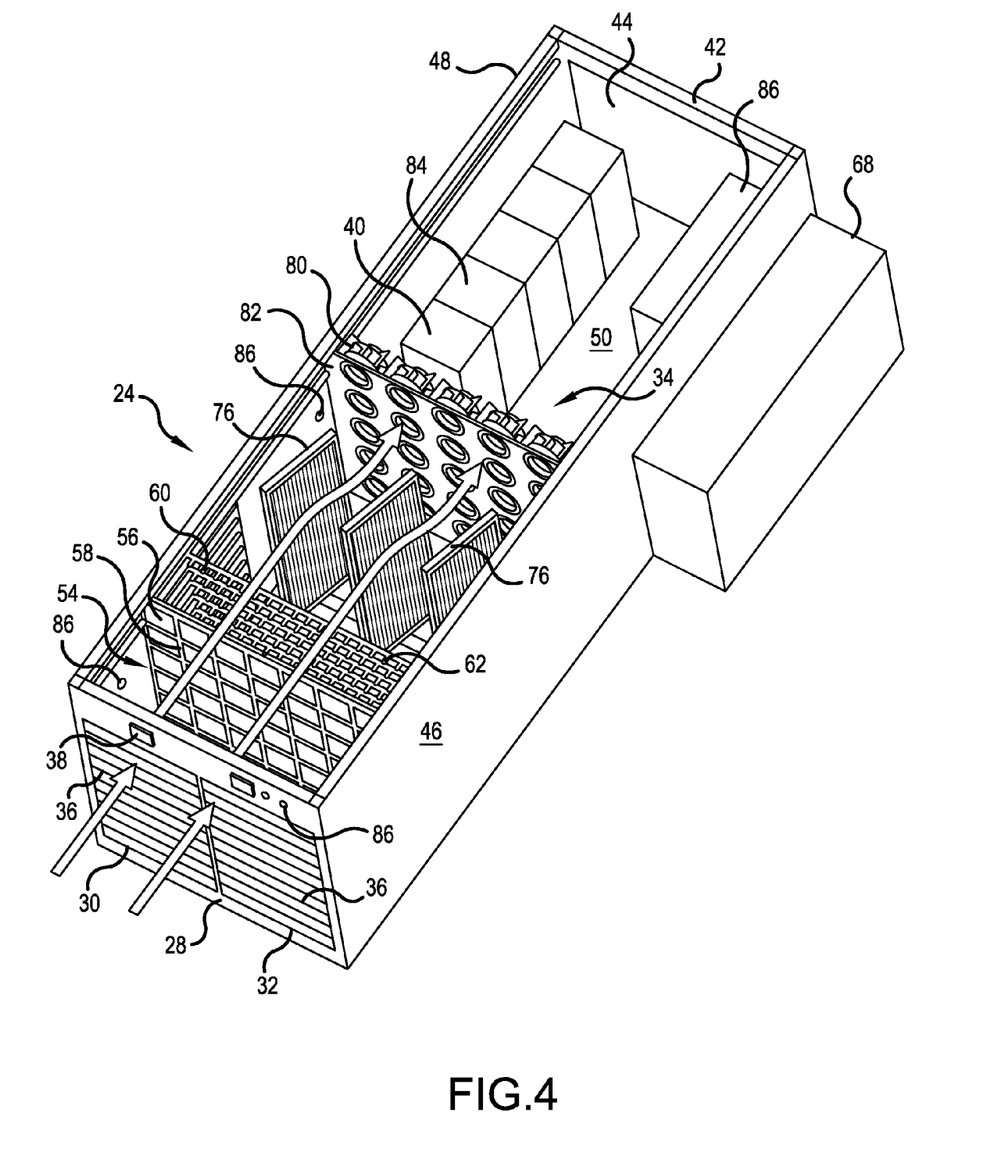
FIG. 4 is a perspective view of the cooling module of FIG. 2 with the mist collector in a second configuration for reducing air flow resistance through the cooling module when mist removal is not required.

The mist collector 74 is only needed when the spray nozzles 62 are in use. At other times the presence of the mist collector 74 in the air flow pathway through the cooling module 24 may present an unnecessary resistance to air flow. The mist collector 74 therefore may comprises a plurality of supports 76 for the mist collector element that are mounted for rotation about a center vertical axis of each support 76. The supports 76 are positioned in a first position, illustrated in FIG. 3, perpendicular to the air flow direction, generally parallel to the filter bank 54 when the spray nozzles 62 are in use so that substantially all air passing through the cooling module 24 must also pass through the mist collector 74 before reaching the outlet 44 of the cooling module 24. When the spray nozzles 62 are not in use, the mist collector supports 76 are rotated to a second position, perpendicular or generally perpendicular to the filter bank 54 so that a smaller proportion of the air flowing through the cooling module 24, or no air at all, flows through the mist collector supports 76. FIG. 4 shows the mist collector supports 76 in a generally perpendicular position. In this manner, mist can be efficiently removed from the air flow when adiabatic cooling is desired without presenting an unnecessary flow resistance to the airflow when adiabatic cooling is not needed. Three mist collector supports 76 are illustrated herein, but more or fewer supports could be used. In addition, while the supports 76 are illustrated as rotating about a vertical axis through their centerlines, they could pivot about a vertical axis at an edge of each support in the manner of a door. Alternately, the supports 76 could pivot about a central horizontal axis and/or fold up and down about a horizontal axis at an edge of the support toward the cover 52 or floor 50.

Downstream from the mist collector 74 is a fan bank 78 comprising a plurality of fan modules 80 mounted in a frame 82. The fan modules 80 are also under the control of the controller 40. When operating, the fan modules 80 draw air into the cooling module 24 through the filter bank 54 and the array of pipes 60 and drive the air toward the outlet 44. The speeds of the fan modules 80 are controlled by the controller 40 and may be increased when the mist collector supports 76 are in the first position and decreased when the mist collector supports 76 are in the second position to move a similar amount of air using a reduced amount of power. Additional equipment, such as uninterruptible power supplies 84 and a transformer 86 may also be located in the cooling module 24 between the fan bank 78 and the outlet end wall 42 so that the cooling module 24 provides many of the power needs of the data center module 22 as well. The controller 40 may be located in the interior 34 with the uninterruptible power supply 84 or in the exterior housing 68 and be connected by wires (not specifically illustrated) or wirelessly with the various sensors, actuators and other elements in the data center module 22.

The cooling module 24 includes a plurality of sensors 86 at various locations throughout the interior 34 and exterior thereof which sensors 86 may individually comprise temperature, humidity or pressure sensors or a combination of one or more of those sensor types. The sensors 86 communicate with the controller 40 over wires or wirelessly to provide the controller 40 with information on temperature, pressure and humidity conditions inside and around the cooling module 24.

Figure 5:
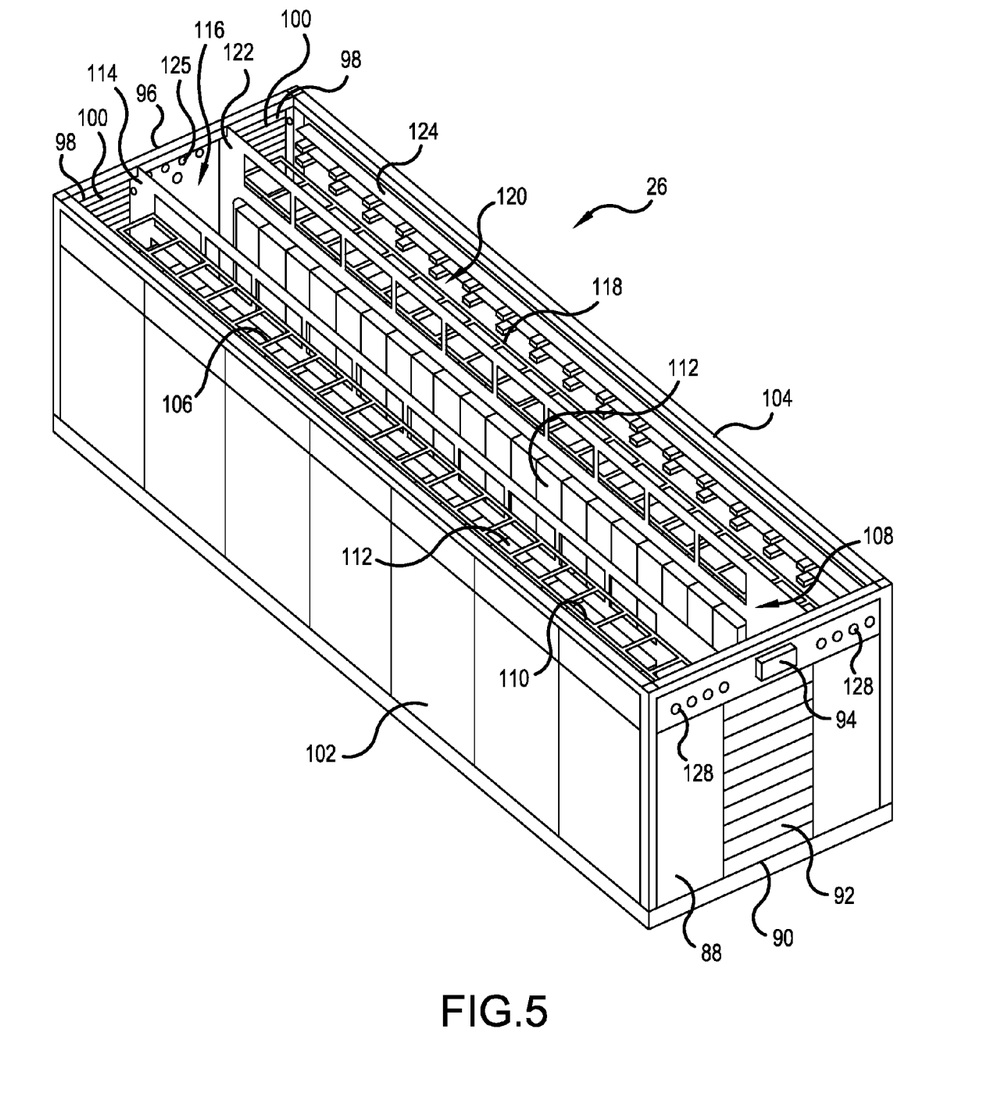
FIG. 5 is a perspective view of the first server module of FIG. 2 and first and second server racks therein.

FIG. 5 illustrates the first server module 26 which comprises an intake end wall 88 having a centrally disposed intake opening 90 selectively closable by louvers 92, the positions of which are controlled by an actuator 94. The first server module 26 also includes an outlet end wall 96 having two outlets 98 that are selectively closable by louvers 100. A first side wall 102 and a second side wall 104 connect the intake end wall 88 and the outlet end wall 96 of the first server module 26. The outlets 98 are located on either side of the vertical centerline of the outlet end wall 96, one near each of the first side wall 102 and the second side wall 104.

A first rack 106 is located in the interior 108 of the server module 26 and extends generally from the intake end wall 88 to the outlet end wall 96. The first rack 106 is spaced from the first side wall 102 by a first gap 110 and supports a plurality of servers 112 or other computer or communication or control equipment. The first gap 110 may also extend around the ends of the first rack 106 between the intake end wall 88 and the first rack 106 and between the outlet end wall 96 and the first rack 106. A first panel 114 on the side of the first rack 106 opposite the first gap 110 defines one side of a center aisle 116 of the first server module 26. A second rack 118 is located across the center aisle 116 from the first rack 106 and is spaced from the second side wall 104 by a second gap 120. The second gap 120 may also extend around the ends of the second rack 118 between the intake end wall 88 and the second rack 118 and between the outlet end wall 96 and the second rack 118. A second panel 122 defines the second side of the center aisle 116. The first server module 26 also has first and second power distribution buses 124 on the first and second side walls 102 and 104, the power distribution bus 124 on the second side wall 104 being visible in FIG. 5. A plurality of temperature and/or humidity and/or pressure sensors 125 are located in the first and second server modules 26 and 27.

Figure 6:
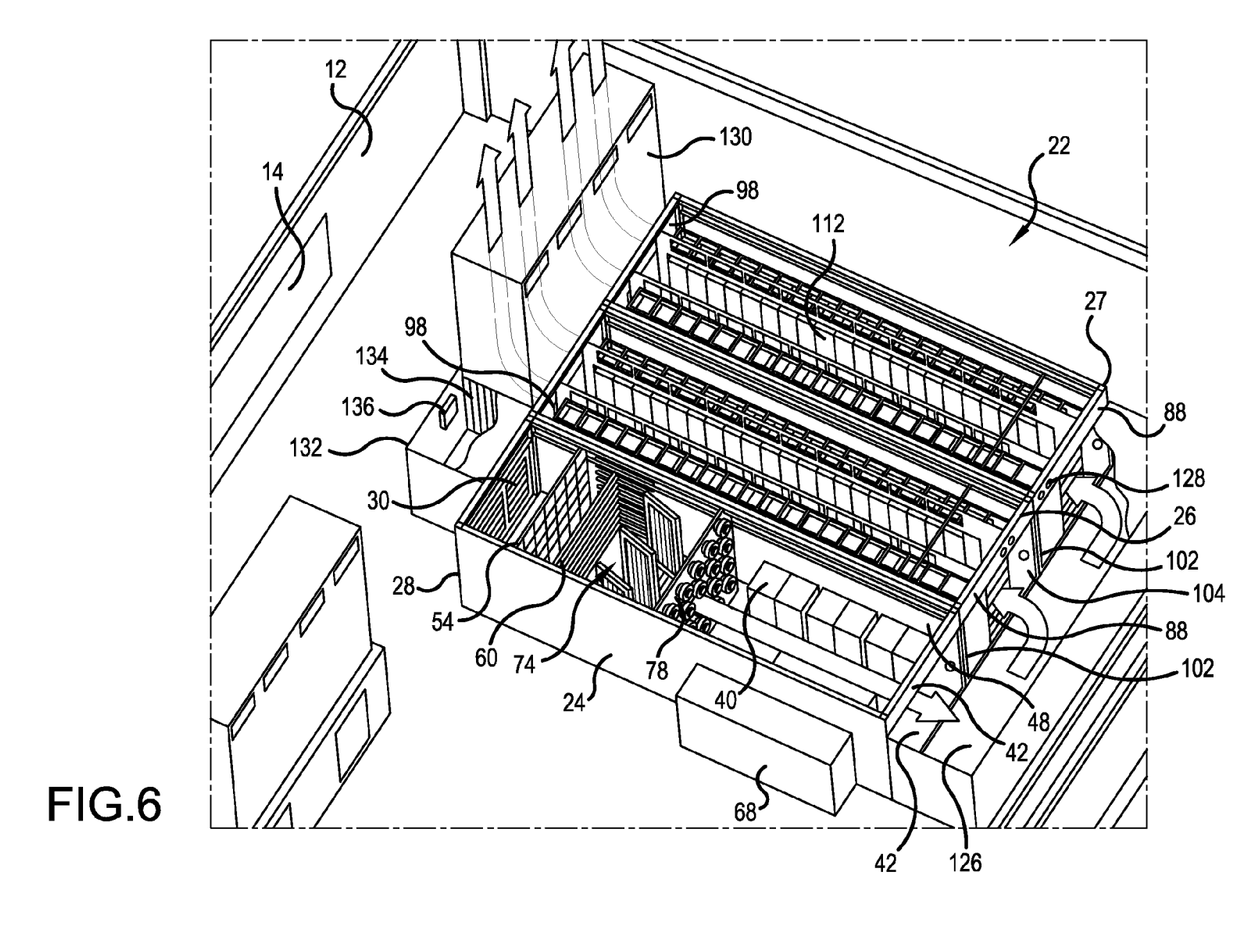
FIG. 6 is a perspective view of the cooling module of FIG. 4 connected to first and second server modules by a cooling plenum and showing an exhaust plenum.

FIG. 6 illustrates the arrangement of the data center module 22 in the data center 10 and the relative orientation and interconnection of the cooling module 24 and the first and second server modules 26, 27. The cooling module 24 is oriented so that the intake end wall 28 of the cooling module faces in the direction of the wall vent opening 14 of the data center 10 and so that the cooling module outlet wall 42 is further away from the data center wall vent opening 14. The first server module 26 is located adjacent to the cooling module 24 such that the first side wall 102 of the first server module 26 is adjacent to the second side wall 48 of the cooling module 24 and so that the intake end wall 88 of the first server module 26 is located adjacent to the outlet end wall 42 of the cooling module 24. The second server module 27 is located with its first side wall 102 against or aligned with the second side wall 104 of the first server module 26 and with its intake end wall 88 adjacent to the intake end wall 88 of the first server module 26. A cooling plenum 126 is located over the outlet 44 of the cooling module 24 and over the intakes 90 of the first and second server modules 26, 27 so that cool air exiting the cooling module 24 enters the cooling plenum 126. The cooling plenum 126 is connected to the cooling module 24 and to the first and second server modules 26, 27 in a substantially airtight manner such that substantially all air exiting the cooling module 24 must enter one of the first and second server modules 26, 27. A plurality of temperature and/or humidity and/or pressure sensors 128 are located in the cooling plenum 126.

An exhaust plenum 130 is located over the outlets 98 at the outlet end walls 88 of the first and second server modules 26, 27 and connects to one of the roof vent openings 18 of the data center 10 so that hot air exiting the first and second server modules 26, 27 can be removed from the data center 10. An intake plenum 132 is connected between the exhaust plenum 130 and the first intake opening 30 of the cooling module 24 and separated from the exhaust plenum 130 by louvers 134 controllable by an actuator 136 in communication with the controller 40.

Figure 7:
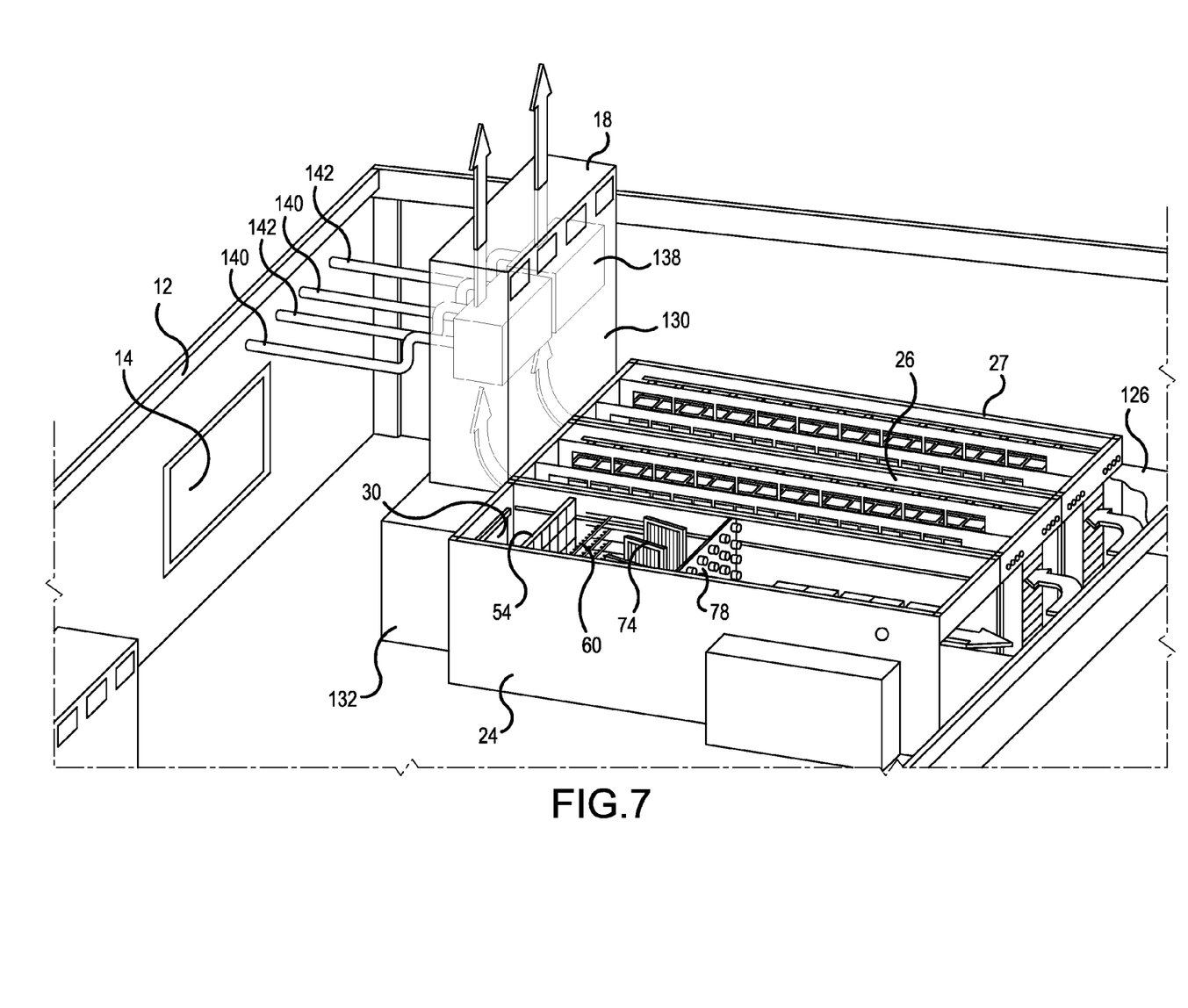
FIG. 7 is a perspective view of the data center module of FIG. 6 showing a heat exchanger in the exhaust plenum.
Figure 8:
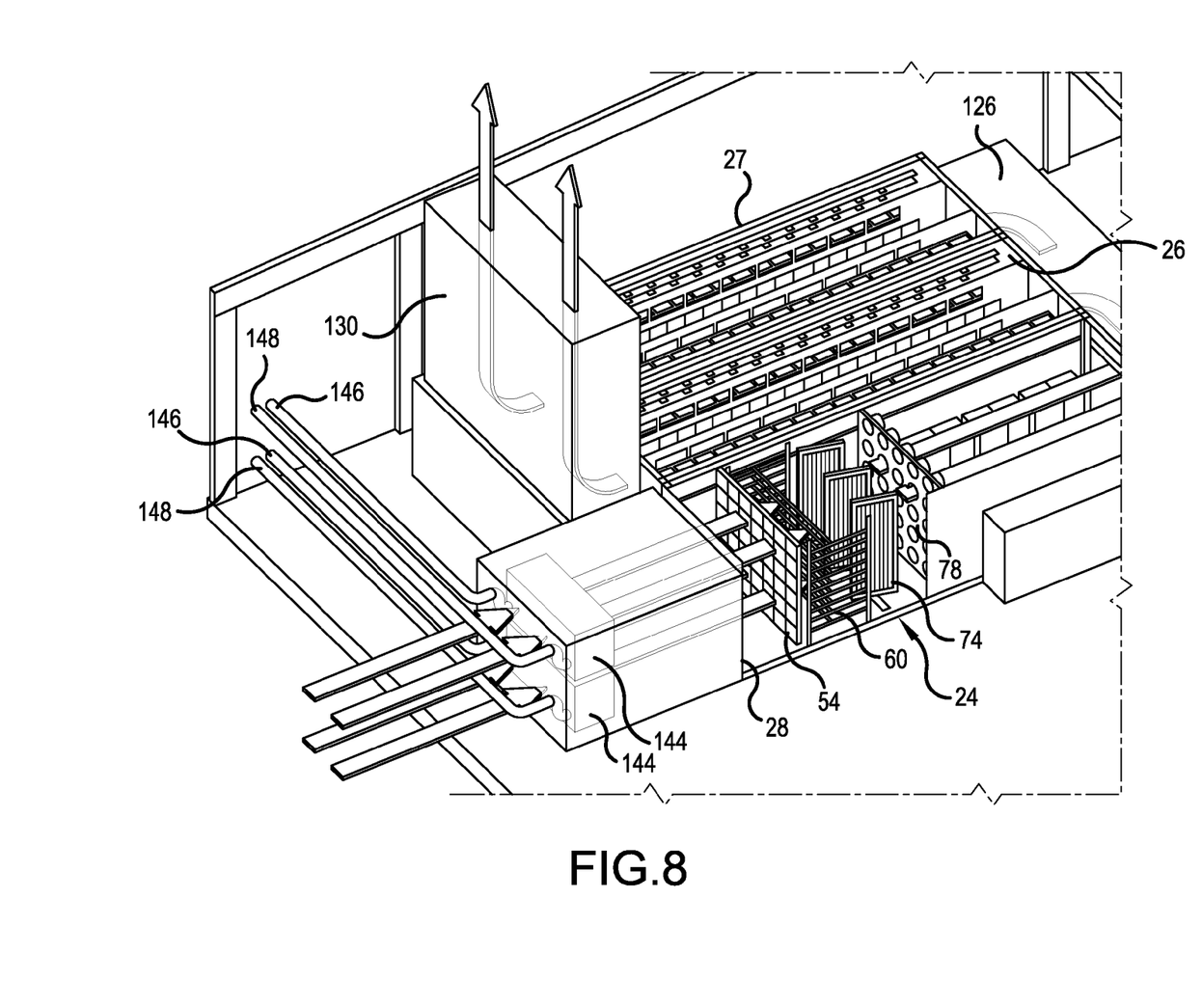
FIG. 8 is a perspective view of the data center module of FIG. 6 showing a heat exchanger upstream of the cooling module.

FIG. 7 shows a first heat exchanger 138 located in the exhaust plenum 130 with inlet pipes 140 and outlet pipes 142 leading into and away from the first heat exchanger 138, respectively. FIG. 8 shows a second heat exchanger 144 located between the data center wall vent opening 14 and the cooling module intake end wall 28 with inlet pipes 146 and outlet pipes 148 leading into and out of the second heat exchanger 144. The first and second heat exchangers 138, 144 are optional and are not required for system operation.

The operation of the above described system will now be described with reference to FIG. 2. The cooling module 24 has two primary operating states. In a first, or free-cooling state, the fan modules 80 operate to draw air into the cooling module 24 from the wall vent openings 14 in the data center. In the free-cooling state, the mist collector supports 76 are rotated to the second position discussed above so as not to interfere significantly with air flow through the cooling module 24. The fan modules 80 draw air through the filter bank 54 and force it out of the outlet 44 of the cooling module 24 into cooling plenum 126 thus increasing the pressure inside the cooling plenum. From the cooling plenum 126, this air enters the first and second server modules 26, 27 through the intake openings 90 in the intake end walls 88 and flows into the center aisles 116 of the server modules. The outlets 98 in the outlet end walls 96 of the first server module 26 are not located in the center aisle 116; therefore, air from the center aisle 116 must pass through the server racks on either side of the center aisle 116 and into the first and second gaps 110, 120 adjacent the first and second side walls 102, 104 of the first server module 26 to reach the outlets 98 and pass into the exhaust plenum 130.

When the ambient temperature outside the data center 10 is cool enough to provide adequate cooling for the servers 112 in the first and second server modules 26, 27, the cooling module 24 is operated in this free-cooling mode. The controller 40 receives input from the temperature sensors 125 in the first and second server modules 26, 27 to determine whether a desired temperature is being maintained in the first and second server modules 26, 27, and the controller 40 can increase or decrease the speed of the fan modules 80 to affect this temperature. If the air entering the cooling module 24 is too cold to be used for cooling the servers 112, the controller 40 operates the actuator 136 controlling the louvers 134 separating the exhaust plenum 130 from the intake plenum 132 in order to mix some of the heated air exiting the first and second server module 26, 27 with the air entering the cooling module 24. The louvers 36 at the second intake opening 32 can also be partially closed, if necessary, to reduce the amount of cold air drawn into the cooling module through the wall vent opening 14 of the data center 10.

The amount of heated air supplied to the first intake opening 30 of the cooling module 24 from the exhaust plenum 130 is varied as necessary to maintain appropriate temperatures in the cooling module 24 and the first and second server modules 26, 27. Under such operating conditions, the servers 112 in the first and second server modules 26, 27, can be maintained at acceptable operating temperature without the use of a conventional air conditioning system. If the temperature of the first and second server modules 26, 27, rises above a predetermined temperature, or if the ambient air is too warm to be effective for cooling the first and second server modules 26, 27, the controller 40 rotates the mist collector supports 76 to their first position extending across the width of the interior 34 of the cooling module 24, actuates the pumps 70 to begin the spraying of mist from the spray nozzles 62 and increases the speed of the fan modules 80 to compensate for the increased air resistance presented by the mist collector supports 76. The evaporation of the mist created by the nozzles 62 will cool the air moving through the cooling module 24 so that cool air can be provided to cooling plenum 126 and to the first and second server modules 26, 27, to help maintain the temperature of the first and second server modules 26, 27 at a desired level. The pump 70 can also be operated to add moisture to the air in the cooling module 24 and thus in the first and second server modules 26, 27, under conditions where the humidity level in the first and second server modules 26, 27, is too low. If the use of the adiabatic cooling system to increase humidity results in a temperature that is too low for cooling the first and second server modules 26, 27, the controller 40 may operate the actuator 136 to allow heated air from the exhaust plenum 130 into the intake plenum 132 and into the cooling module 24.

The controller 40 receives inputs from the pressure and temperature sensors in the first and second server modules 26, 27, and uses this information to control the actuators 94 associated with the intake openings 90 of the first and second server modules 26, 27. It may be desirable, for example, to close the louvers 92 of the first server module 26 to a greater degree than the louvers 92 of the second server module 27 in order to maintain the same air flow through the first and second server modules 26, 27, in view of the fact that the second server module 27 is located further from the cooling module 24 and that the air from the cooling module 24 must travel a greater distance to reach the second server module 27. Maintaining equal pressures in the first and second server modules 26, 27, is one way to obtain a substantially equal amount of cooling in both server modules 26, 27. Further adjustments to the louvers 92 of the intake openings 90 of the first and second server modules can be made based on temperature measurements received by the controller 40 from temperature sensors 125 located in the first and second server modules 26, 27. Only a few sensors 125 are illustrated in the figures. However, it may be desirable to provide a relatively large number of temperature sensors in the first and second server modules 26, 27, in order to detect regions of locally high temperature that could damage a particular one of the servers 112, even though the temperatures at the intake opening 90 and outlets 98 are within normal operating ranges. Pressure sensors may also be provided both in the center aisle 116 and the first and second gaps 110, 120 of the first and second server modules 26, 27, in order to ensure an adequate air flow through the first and second racks 106, 118. If the pressure difference between the center aisle 116 and the first or second gap 106, 118 becomes too great, this could indicate a blockage of airflow passages over and around the servers 112 and require either an increased air flow to the affected one of the server modules or require the triggering of an alarm to alert an operator of a potential problem.

In the embodiment described above, the air from the exhaust plenum 130 is vented to the environment surrounding the data center 10. When the first heat exchanger 138 is present in the exhaust plenum 130, however, a fluid entering the first heat exchanger 138 through the inlet pipes 140 will be heated by the warm air passing over or through the first heat exchanger 138, and the heated fluid in the outlet pipes 142 may be used to heat other portions of the data center 10 or be provided to nearby buildings, such as house for use in domestic water heating or for the heating of living space.

When the air outside the data center 10 is too warm for use in cooling the first and second server modules 26, 27, even with the adiabatic cooling provided by spray nozzles 62, additional cooling may be provided by the second heat exchanger 144. This second heat exchanger may be connected to a conventional evaporator/condenser air conditioning system (not illustrated) and be used only at times when the ambient temperature is too high to allow for free-cooling or adiabatic cooling of the server modules 26. Alternately, if a natural source of cool water, such as a river or a lake, is available near the data center 10, water from this water source can be routed through the second heat exchanger 144 to pre-cool the air entering the cooling module 24.

The present invention has been described herein in terms of presently preferred embodiments. However, modifications and additions to these embodiments will become apparent to those of ordinary skill in the art upon a reading of the foregoing disclosure. It is intended that all such modifications and additions comprise a part of this invention to the extent they fall within the scope of the several claims appended hereto.

What is claimed is:

1. A cooling module for cooling at least one server module configured to house a plurality of servers, the cooling module comprising:
    a housing having an interior containing air;
    an intake into the housing;
    an outlet from the housing;
    at least one fan configured to move the air from the intake to the outlet;
    at least one sprayer configured to spray a mist into the air in the interior for evaporative cooling of the interior; and
    a mist collector for removing at least some of the mist from the air in the interior, wherein the mist collector comprises a plurality of mist collector elements mounted on a support and wherein the support is shiftable from a first position in which the plurality of mist collector elements and the support reside in a first plane and a first portion of the air in the interior moving from the intake to the outlet passes through the plurality of mist collector elements on the support and the mist collector removes a first portion of mist from the first portion of the air, to a second position in which the plurality of mist collector elements and the support reside in a second plane, wherein the first plane is more perpendicular to the air flow direction than the second plane, and a second portion of the air in the interior moving from the intake to the outlet passes through the plurality of mist collector elements on the support, wherein the second portion of the air is less than the first portion of the air and the mist collector removes a second portion of mist, less than the first portion of mist, from the second portion of the air, or the second portion of the air is substantially zero as the air flows around the support and bypasses the plurality of mist collector elements and the mist collector removes substantially no mist.

2. The cooling module of claim 1, wherein the at least one sprayer comprises a plurality of spray nozzles.

3. The cooling module of claim 1, wherein the at least one fan comprises a plurality of fan modules mounted in a support frame.

4. The cooling module of claim 1, wherein the at least one support is mounted for pivotable motion about an axis perpendicular to an airflow direction in the housing.

5. The cooling module of claim 1, wherein the plurality of mist collector elements are a first plurality of mist collector elements formed of wires, rods or plates and the support is a first support, and the mist collector further comprising:
  a second plurality of mist collector elements formed of wires, rods or plates mounted on a second support and wherein the second support is shiftable from a first position in which a third portion of the air in the interior moving from the intake to the outlet passes through the second plurality of mist collector elements on the second support to a second position in which a fourth portion of the air in the interior moving from the intake to the outlet passes through the second plurality of mist collector elements on the second support, wherein the fourth portion is less than the third portion or is substantially zero.

6. The cooling module of claim 1, wherein the at least one server module comprises at least two server modules and including a plenum connected to the cooling module and to the at least two server modules and configured to guide air from the cooling module outlet to inlets of the at least two server modules.

7. The cooling module of claim 1 including a controller for controlling operation of the at least one fan and for controlling operation of the at least one sprayer and for controlling the position of the support.

8. The cooling module of claim 7 including a plurality of sensors for sensing at least one of temperature, humidity and pressure.

9. A system comprising a cooling module and first and second server modules,
  the first server module including a housing having a floor, a roof, a first end wall, a second end wall, a first side wall connecting the first end wall to the second end wall and a second side wall spaced from the first side wall and connecting the first end wall to the second end wall; the floor, roof and walls defining an interior, an inlet into the interior formed in the first end wall, plural rows of racks holding a plurality of servers located in the interior, and at least one outlet for air to escape from the interior;
  the second server module including a housing having a floor, a roof, a first end wall, a second end wall, a first side wall connecting the first end wall to the second end wall and a second side wall spaced from the first side wall and connecting the first end wall to the second end wall, the floor, roof and walls defining an interior, an inlet into the interior formed in the first end wall, plural rows of racks holding a plurality of servers located in the interior, and at least one outlet for air to escape from the interior;
  the cooling module including a housing having a floor, a roof, a first end wall, a second end wall, a first side wall connecting the first end wall to the second end wall and a second side wall spaced from the first side wall and connecting the first end wall to the second end wall, the floor, roof and walls defining an interior, an inlet into the cooling module interior formed in the first end wall and an outlet from the cooling module interior for cooled air to escape from the interior, at least one fan configured to move air through the cooling module interior to the cooling module outlet, and at least one sprayer configured to spray a mist into the cooling module interior, the cooling module further including a mist collector for removing at least some of the mist from the air in the cooling module interior, wherein the mist collector comprises a plurality of mist collector elements mounted on a support and wherein the support is shiftable from a first position in which the plurality of mist collector elements and the support reside in a first plane and a first portion of the air in the cooling module interior moving from the cooling module intake to the cooling module outlet passes through the plurality of mist collector elements on the support and the mist collector removes a first portion of mist from the first portion of the air, to a second position in which the plurality of mist collector elements and the support reside in a second plane, wherein the first plane is more perpendicular to the air flow direction than the second plane, and a second portion of the air in the cooling module interior moving from the cooling module intake to the cooling module outlet passes through the plurality of mist collector elements on the support, wherein the second portion of the air is less than the first portion of the air and the mist collector removes a second portion of mist, less than the first portion of mist, from the second portion of air, or the second portion of the air is substantially zero as the air flows around the support and bypasses the plurality of mist collector elements and the mist collector removes substantially no mist; and
  a plenum connecting the cooling module outlet to the inlets formed in the first end walls of the first and second server modules.

10. The system of claim 9, wherein the first server module housing has the first server module housing outlet formed in the second end wall, wherein the plural rows of racks in the first server module comprises a first rack spaced from the first side wall by a first gap and a second rack spaced from the first rack by a center aisle and spaced from the second side wall by a second gap, wherein the inlet of the first server module is configured to allow air into the center aisle, wherein the at least one outlet of the first server module comprises a first outlet for allowing air to exit from the first gap and a second outlet for allowing air to exit from the second gap, wherein the plurality of servers are mounted in the first rack and in the second rack of the first server module such that air entering the inlet of the first server module must flow through the first rack or the second rack of the first server module to reach the first or second outlets of the first server module.

11. The system of claim 9, including a first plurality of sensors in the cooling module, a second plurality of sensors in the first server module, and a third plurality of sensors in the second server module and a controller in communication with the first, second and third pluralities of sensors, the controller configured to control the at least one fan module and the at least one sprayer based on signals received from the first, second and third pluralities of sensors.

12. The system of claim 11, including a pathway from the first server module outlet to the cooling module inlet, at least one flap for selectively controlling airflow from the outlet of the first server module to the inlet of the cooling module and an actuator for moving the at least one flap, the actuator being in communication with the controller.

13. The system of claim 9 including a first heat exchanger positioned in an airflow from the first server module such that a heat transfer medium in the first heat exchanger is heated by heat from the plurality of servers in the first server module.

14. The system of claim 13, including a second heat exchanger carrying a coolant and positioned to cool air upstream of said sprayer.

15. A system comprising a cooling module and first and second server modules,
- the first and second server modules each including a housing having an interior, an inlet into the interior and an outlet from the interior,
- the cooling module including a housing having an interior, at least one inlet into the cooling module interior and an outlet from the cooling module interior;
- a cooling plenum connecting the cooling module outlet to the inlet of the first server module and to the inlet of the second server module;
- an exhaust plenum connecting the outlet of the first server module and the outlet of the second server module;
- an inlet plenum connecting the exhaust plenum to the at least one inlet into the cooling module interior;
- a controller; and
- a plurality of sensors in communication with the controller;
- wherein the cooling module comprises at least one fan configured to draw air through the at least one inlet of the cooling module into the cooling module interior and to expel air through the cooling module outlet into the cooling plenum, a filter for filtering substantially all air flowing through the cooling module, a plurality of spray nozzles configured to spray a mist into the cooling module interior, a mist collector comprising a plurality of mist collector elements mounted to a support for removing at least some of the mist from the air in the cooling module interior, the support being mounted for rotation about an axis perpendicular to an airflow direction through the cooling module and being shiftable from a first position in which the plurality of mist collector elements and the support reside in a first plane and a first portion of the air in the cooling module interior moving from the at least one intake of the cooling module to the cooling module outlet passes through the plurality of mist collector elements and the mist collector removes a first portion of mist from the first portion of the air to a second position in which the plurality of mist collector elements and the support reside in a second plane, wherein the first plane is more perpendicular to the air flow direction than the second plane, and a second portion of the air in the cooling module interior moving from the at least one intake of the cooling module to the cooling module outlet passes through the plurality of mist collector elements, wherein the second portion of the air is less than the first portion of the air and the mist collector removes a second portion of mist, less than the first portion of mist, from the second portion of the air, or the second portion of the air is substantially zero, as the air flows around the support and bypasses the plurality of mist collector elements and the mist collector removes substantially no mist,
- wherein the first server module housing includes a first end wall at an intake end of the first server module housing, a second end wall at an outlet end of the first server module housing, a first side wall and a second side wall spaced from the first side wall and connecting the first end wall and the second end wall, a first rack spaced from the first side wall by a first gap, and a second rack spaced from the first rack by a center aisle and spaced from the second side wall by a second gap, wherein the inlet of the first server module is configured to allow air from the cooling plenum into the center aisle of the first server module and the at least one outlet of the first server module comprises a first outlet from the first gap to the exhaust plenum and a second outlet from the second gap to the exhaust plenum, wherein the plurality of servers are mounted in the first rack and in the second rack of the first server module such that substantially all air entering the inlet of the first server module must flow through the first rack or the second rack of the first server module to reach the first or second outlets of the first server module;
- a first heat exchanger positioned upstream of the plurality of spray nozzles for cooling air entering the cooling module;
- a second heat exchanger in the exhaust plenum carrying a heat transfer medium to be heated by air exiting the first server module;
- a first plurality of louvers for controlling airflow to the cooling module intake and a first actuator for controlling the position of the first plurality of louvers; and
- a second plurality of louvers in the exhaust plenum for controlling air flow from the exhaust plenum to the inlet plenum and a second actuator for controlling the position of the second plurality of louvers,
- wherein the controller is configured to control the first actuator, the second actuator, the plurality of fans, fluid flow through the plurality of spray nozzles, the position of the support, the positions of the first plurality of louvers and the positions of the second plurality of louvers based on signals received from the sensors.

* * * * *